(12) United States Patent
Tae et al.

(10) Patent No.: US 7,768,235 B2
(45) Date of Patent: Aug. 3, 2010

(54) BATTERY MANAGEMENT SYSTEM AND METHOD FOR AUTOMOTIVE VEHICLE

(75) Inventors: Yong-Jun Tae, Yongin-si (KR);
  Soo-Seok Choi, Yongin-si (KR);
  Young-Jo Lee, Yongin-si (KR);
  Han-Seok Yun, Yongin-si (KR);
  Se-Wook Seo, Yongin-si (KR);
  Gye-Jong Lim, Yongin-si (KR);
  Beom-Gyu Kim, Yongin-si (KR);
  Ho-Young Park, Yongin-si (KR)

(73) Assignee: Samsung SDI Co., Ltd., Suwon-si (KR)

(*) Notice: Subject to any disclaimer, the term of this patent is extended or adjusted under 35 U.S.C. 154(b) by 482 days.

(21) Appl. No.: 11/768,506

(22) Filed: Jun. 26, 2007

(65) Prior Publication Data

US 2008/0074082 A1 Mar. 27, 2008

(30) Foreign Application Priority Data

Sep. 26, 2006 (KR) ............... 10-2006-0093590

(51) Int. Cl.
  *H01M 10/44* (2006.01)
  *H01M 10/46* (2006.01)

(52) U.S. Cl. ........................ 320/134; 320/136

(58) Field of Classification Search ............ 320/107, 320/132, 134, 136, 149, 150; 324/426, 427, 324/430, 433
See application file for complete search history.

(56) References Cited

U.S. PATENT DOCUMENTS

| | | | |
|---|---|---|---|
| 5,530,336 A | 6/1996 | Eguchi et al. | |
| 2005/0024061 A1* | 2/2005 | Cox et al. | ............... 324/426 |
| 2008/0054850 A1* | 3/2008 | Tae et al. | ............... 320/136 |

FOREIGN PATENT DOCUMENTS

| | | |
|---|---|---|
| JP | 2000-221249 | 8/2000 |
| JP | 2004-222433 | 8/2004 |
| JP | 2005-269752 | 9/2005 |
| KR | 1994-8189 | 4/1994 |
| KR | 2004-5133 | 1/2004 |

* cited by examiner

*Primary Examiner*—Edward Tso
(74) *Attorney, Agent, or Firm*—Stein McEwen, LLP

(57) ABSTRACT

A battery management system and method. The battery management system manages a battery of a hybrid vehicle including a motor, a battery, and a main switch connecting the motor and the battery. The battery management system includes a sensing unit and an MCU. The sensing unit measures the current, the voltage and the temperature of the battery. The MCU integrates the battery current to produce an integrated current value, and determines whether the battery is overcharged or over discharged using the integrated current value.

23 Claims, 5 Drawing Sheets

BATTERY MANAGEMENT SYSTEM AND METHOD FOR AUTOMOTIVE VEHICLE

CROSS-REFERENCE TO RELATED APPLICATIONS

This application claims the benefit of Korean Application No. 2006-93590 filed on Sep. 26, 2006, in the Korean Intellectual Property Office, the disclosure of which is incorporated herein by reference.

BACKGROUND OF THE INVENTION

1. Field of the Invention

Aspects of the present invention relate to a battery management system and method. More particularly, aspects of the present invention relate to a method of detecting overcharge and over discharge of a battery management system that is capable of being used in a vehicle using an electrical energy.

2. Description of the Related Art

Vehicles using a gas or diesel internal combustion engine cause pollution, such as air pollution. Recently, in order to reduce the pollution, intensive research has been conducted to develop electric vehicles, and hybrid vehicles.

Electric vehicles use electric motors that are operated by electrical energy output from batteries. These electric vehicles use batteries that have a plurality of rechargeable battery cells formed into a pack, as a main power source. Electric vehicles can benefit the environment because they do not discharge polluting gases and they operate at a reduced noise level.

A hybrid vehicle is a cross between a vehicle using an internal combustion engine and an electric vehicle. A hybrid vehicle uses two or more power sources, for example, an internal combustion engine and an electric motor. Hybrid vehicles that use an internal combustion engine and a fuel cell have been developed. A fuel cell facilitates a chemical reaction between hydrogen and oxygen to obtain electrical energy. In addition, hybrid vehicles that use a battery and a fuel cell have also been developed.

As mentioned above, in a battery powered electric vehicle the performance of the battery directly influences the performance of the vehicle. Therefore, a battery management system that efficiently manages the charge and discharge of the battery, by measuring the battery cell voltages and/or current, would be beneficial.

Related art methods of detecting whether the battery is overcharged and/or over discharged have shortcomings in that when an error occurs in a battery voltage detecting circuit, overcharge and/or over discharge of the battery can continuously occur.

The information disclosed in the Background section is intended only to enhance the understanding of the background of the invention and does not constitute prior art.

SUMMARY OF THE INVENTION

Aspects of the present invention have been made in an effort to provide a battery management system and method capable of precisely detecting the overcharge and/or over discharge of a battery in a battery system.

According to various aspects of the present invention, a battery management system is provided for a vehicle that comprises a power device, a battery including a plurality of battery cells, and a main switch connecting the power device and the battery. The battery management system comprises a sensing unit that measures the current, the voltage, and/or the temperature of the battery The battery management system comprises a micro controller unit (MCU) that integrates the measurements to generate the integrated current value, and/or determines whether the battery is overcharged or over discharged, using the integrated current value.

According to some embodiments, the battery management system further comprises a protective circuit unit that determines whether the battery is overcharged or over discharged, by comparing the battery voltage and a threshold voltage range. The MCU comprises an initial SOC calculator that calculates an initial state of charging (SOC). To calculate an integrated current value corresponding to the initial SOC, a current integrator estimates an integrated current value, using a current integrating method that accumulates the battery current to an integrated current value that corresponds to an initial SOC. A controller receives the integrated current value from the current integrator, and determines whether the battery is overcharged or over discharged. The initial SOC calculator can calculate an SOC in two ways, depending on how long a vehicle has been turned off. More specifically, the particular initial charge determination method depends upon the time period (idle time) between when a vehicle is turned off (key-off) and turned on (key-on).

According to some embodiments, when the idle time is less than a reference idle period, the initial SOC calculator uses the SOC recorded when the vehicle was turned off as the initial Soc.

In some embodiments, when the period between the previous key-off time and the current key-on time is longer than the reference idle period, the initial SOC calculator performs a calculation to determine the initial SOC. This calculation can involve using a data table to determine the initial SOC, based upon battery measurements. The battery measurements can be, for example, the open current voltage (OCV) and the temperature of the battery. The battery management system can comprise a data storage unit that stores the data table. The battery management system can comprise a current integrator that integrates the battery current with respect to time, to calculate the current integrated current value.

According to various embodiments, the battery management system can comprise a controller that determines whether the battery is over discharged or overcharged based on the integrated current value. For example, if the integrated current value is less than 0 [Ah], the controller will determine that the battery is over discharged. If the integrated current value exceeds a reference battery rating capacity [Ah], the controller will determine that the battery is overcharged.

According to some embodiments, if the controller determines that the battery is either overcharged or over discharged, it will turn off a main switch to break the connection between the battery and the power device (motor). The threshold voltage range comprises any voltage is equal to or more than a first voltage that indicates that the battery is fully charged, or is equal to or less than a second voltage that indicates the battery is fully discharged. If battery voltage is within the threshold voltage range, the battery is overcharged or over discharged, and the main switch is turned off. The battery management system can also comprise a protective circuit unit that cuts off the connection between the battery and the power device if the battery voltage is within the threshold range.

In some aspects, the present invention provides a method of a battery management. The method can be used in conjunction with a vehicle, for example, a hybrid or electric vehicle. The vehicle can comprise a power device, a battery comprising one or more battery cells, and a main switch connecting the power device and the battery. The method in some aspects comprises: calculating an initial SOC, and setting an integrated current value; generating a current integrated current value; determining whether the battery is overcharged or over discharged; determining whether the battery is overcharged or over discharged.

In some embodiments the calculating of the initial SOC comprises using the SOC recorded at a previous key-off time as the initial SOC, when the period between the previous key-off time and the current key-on time is shorter than a reference idle period.

In various embodiments, the calculating of the initial SOC comprises retrieving the SOC from a data table. Retrieving the SOC from the data table can comprise using a measurement of the OCV of the battery, and a measurement of the temperature of the battery, in conjunction with the data table, to calculate the initial SOC. This method of initial SOC calculation can be used when the period between the previous key-off time and the current key-on time is longer than the reference idle period.

In various embodiments, the detecting of the battery voltage comprises adding a value that represents the integration of the battery current with respect to time, to the integrated initial current value.

In some aspects of the present teachings, the determining whether the battery is overcharged or over discharged comprises, determining whether the battery is over discharged (the integrated current value is less than 0 [Ah]), or whether the battery is overcharged (the integrated current value is more than the reference battery rating capacity [Ah]).

In some embodiments, the determining whether the battery is overcharged or over discharged comprises a comparison with a threshold voltage range. The threshold voltage range comprises any voltage that is larger than a first voltage that relates to the battery voltage when the battery is fully charged, and any voltage that is less than a second voltage that relates to a voltage when the battery is fully discharged. Further, the process comprises determining that the battery is overcharged when the battery voltage is larger than the first voltage, or that the battery is over discharged when the battery voltage is less than the second voltage.

In some embodiments, the method can comprise turning off a main switch when the battery is overcharged or over discharged. Turning off the main switch comprises cutting the connection between the battery and the power device, for example, breaking an electrical communication between the main switch and the power device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
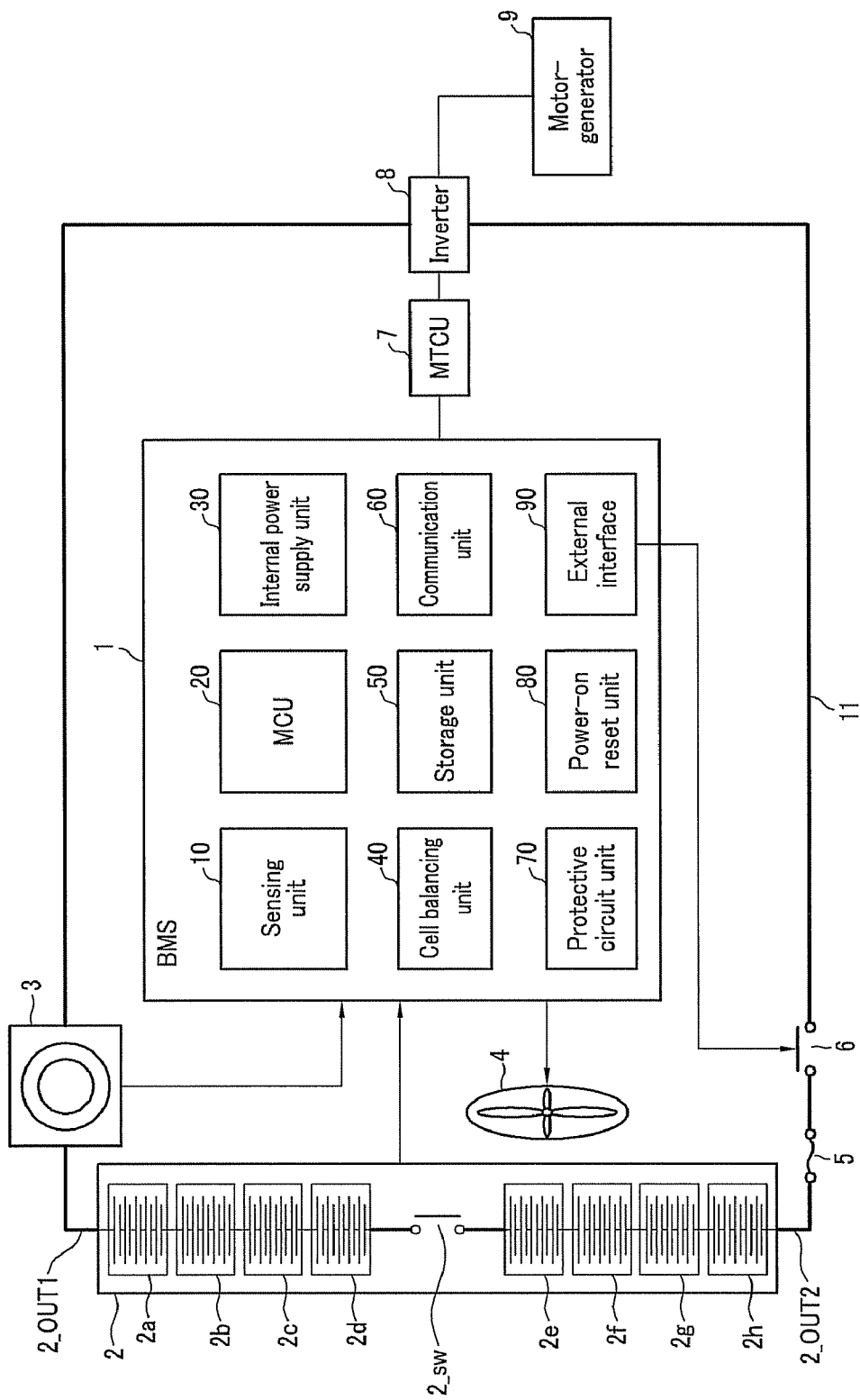
FIG. 1 is a schematic view illustrating battery management system comprising a battery, a BMC, and a peripheral device of the BMS, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In this specification, when a first component is said to be connected to a second component, it indicates that the first component can be directly connected to the second component, and the component can be connected to the second component with a third component disposed therebetween.

Further, when a component is said to comprise an element, it indicates that the component includes the element, but does not necessarily exclude the other non-recited elements from being part of the component.

According to various embodiments, and as shown in FIG. 1, a battery management system 11 comprises a battery management controller (BMC) 1, a battery 2, a current sensor 3, a cooling fan 4, a fuse 5, a main switch 6, an MTCU (Motor Control Unit) 7, an inverter 8, and a motor 9. All the elements of the battery management system can be in electrical communication with one another.

In some embodiments, and as illustrated in FIG. 1, the battery 2 comprises a plurality of sub-packs 2a-2h. Each sub-pack comprises a plurality of battery cells coupled to each other in series. The battery 2 comprises a first output terminal 2_OUT1, and a second output terminal 2_OUT2. A safety switch 2_SW can be disposed between the sub-pack 2d and the sub-pack 2e. In this embodiment, eight sub-packs 2a to 2h are exemplified, and each of the sub-packs represents a plurality of battery cells as one group, but the present disclosure is not limited thereto. Modifications to the batteries and/or sub-packs, including variations in the number of batteries and sub-packs, are within the scope of the present teachings. The safety switch 2_SW can serve as a switch that can be manually turned on and/or off for an operator's safety when the battery is replaced, or while performing a process on the battery. In the exemplary embodiment of FIG. 1, the safety switch 2_SW is disposed between the sub-pack 2d and the sub-pack 2e, but the present teachings are not limited thereto. The first output terminal 2_OUT1 and the second output terminal 2_OUT2 are connected to the inverter 8.

According to some embodiments, the current sensor 3 can function to measure the amount of output current of the battery 2, and can output this information to the sensing unit 10, of the BMC 1. Specifically, the current sensor 3 may comprise, for example, a Hall CT (Hall current transformer) that measures the current using a Hall element, and outputs this information as an analog current signal corresponding to the measured current.

In some embodiments the cooling fan 4 can be connected to the BMC 1. The cooling fan 4 can dissipate the heat that is generated due to the charging and discharging of the battery 2, on the basis of a control signal from the BMC 1. This cooling can prevent the deterioration of the battery 2, and can prevent the lowering of the charging and discharging efficiency due to a rise in temperature.

A fuse 5 can be connected to the battery 2. The fuse 5 can prevent an over current due to, for example, a broken wire or a short circuit of the battery 2, from being transmitted to the battery 2. For example, when an over-current is generated, the fuse 5 is broken, to prevent the over-current from being transmitted to the battery 2.

When an abnormal phenomenon such as overcharge, over discharge, or high temperature is generated, the main switch 6 can function to turn off in response to a control signal from the MTCU (Motor Control Unit) 7. The main switch 6 can function to disrupt the connection between the battery 2 and the motor 9. Hereinafter, the disconnection between the battery 2 and the motor 9 indicates that the connection between the battery 2 and the motor 9 is broken. A motor as described herein, can be an electric motor and/or an electric generator.

In some embodiments, the BMC 1 comprises a sensing unit 10, an MCU (Micro Controller Unit) 20, an internal power supply unit 30, a cell balancing unit 40, a storage unit 50, a communication unit 60, a protective circuit unit 70, a power-on reset unit 80, and an external interface 90. All of the above-mentioned components of the BMC 1 can be in electrical communication with the MCU 20 and/or one another.

The sensing unit 10 can function to measure the battery's current (amperage), voltage, and/or temperature. The sensing unit 10 can transmit one or more of these measurements to the MCU 20.

Hereinafter, the charging and discharging amperage of the battery is simply referred to as a battery current and, the voltage of the output terminal of the battery is referred to as the battery voltage. When a battery comprises a plurality of cells, the temperature of the each of the cells is measured, and the average value of the measured temperatures is referred to as the battery temperature.

In some embodiments, the MCU 20 generates information that indicates the state of the battery 2 by estimating the state of charging (hereinafter, referred to as SOC) of the battery 2. The SOC can be determined on the basis of the battery current, the battery voltage, and the battery temperature as determined by the sensing unit 10. The MCU 20 transfers the information that indicates the condition of the battery 2, to the MTCU 7 of, for example, a vehicle. The MCU 20 can determine the overcharged state and the over discharged state, and transmit the information to the MTCU 7. When an overcharge or over discharge is detected, the MTCU 7 turns off the main switch 6. Turning off the main switch 6 breaks the circuit between the power device of the vehicle and the battery 2. Hereinafter, when the connection between the battery 2 and the power device of the hybrid vehicle is disconnected, the circuit between the battery 2 and the power device is broken.

According to some embodiments, the power device of the hybrid vehicle comprises, for example, the motor 9. In this case, the MCU 20 uses the integrated current value in order to determine the overcharge and the over discharge. The internal power supply unit 30 generally supplies the power supply to the BMC 1 using a supplementary battery (not shown). The cell balancing unit 40 balances the charged states of the individual cells of the battery 2. That is, the cell balancing unit 40 discharges a cell that is relatively fully charged, and charges a cell that is insufficiently charged. The storage unit 50 stores data such as the battery's current SOC, or the status of heating (SOH) when the BMC 1 is powered off. Herein, any suitable memory device may be used as a memory, for example, an electrically erasable programmable read-only memory (EEPROM) may be used for the storage unit 50. The communication unit 60 communicates with the MTCU.

In various embodiments, the protection circuit unit 70 measures the battery voltage, compares the measured battery voltage with a threshold voltage range. The protection circuit unit 70 can determine whether the battery is overcharged or over discharged, on the basis of the comparison. When the battery is overcharged or over discharged, the protective circuit unit 70 turns off the main switch 6. Turning off main switch 6 breaks the connection (circuit) between the motor 9 serving as a power device for the vehicle and the battery. In this case, the threshold voltage range comprises a voltage range higher than a first voltage that indicates that the battery is fully charged. The threshold voltage range also comprises a voltage range that is lower than a second voltage that indicates that the battery is fully discharged. For example, the protective circuit unit 70 can determine that the battery is overcharged if the battery voltage is higher than the first voltage, and that the battery is over discharged if the battery voltage is lower than the second voltage.

In some aspects of the present teachings, the power-on reset unit 80 resets the entire system when the BMC 1 is power-on. Resetting the system can, for example, clear the storage unit and/or activate the sensing unit. The external interface 90 connects the supplementary devices of the BMC, such as the cooling fan 4, or the main switch 6, to the MCU 20.

According to various aspects of the present teachings, the MTCU 7 determines torque requirements on the basis of information from a vehicle being driven, for example, acceleration, braking, vehicle speed, etc. Based on this information, the MTCU 7 controls the output of the motor 9 so as to correspond to the torque requirements. More specifically, the MTCU 7 controls the switching of the inverter 8 to control the output of the motor 9, so as to correspond to the torque requirements of the vehicle. Further, the MTCU 7 receives SOC data relating to the battery 2. This data is transmitted from the MCU 20, through the communication unit 60 of the BMC 1, so that the SOC of the battery 2 can be maintained within a reference value (e.g., 55%). For example, if the SOC transmitted from the MCU 20 is less than 55%, the MTCU 7 controls the switch of the inverter 8, to thereby charge the battery 2. In this case, the current flow to the battery is set at a positive value. In the alternative, if the SOC is more than 55%, the MTCU 7 controls the switch of the inverter 8 to discharge the battery 2 such that the power drawn from the battery 2 is output to the motor 9. In this instance the battery current flow is set at a negative value.

The inverter 8 allows the battery 2 to be charged or discharged on the basis of the control signal from the MTCU 7. The motor 9 drives the vehicle using the electrical energy of the battery 2, on the basis of the torque information transmitted from the MTCU 7.

Hereinafter, various aspects of the battery management system and method that determine the overcharge and the over discharge of the battery will be described with reference to FIGS. 2-4.

Figure 2:
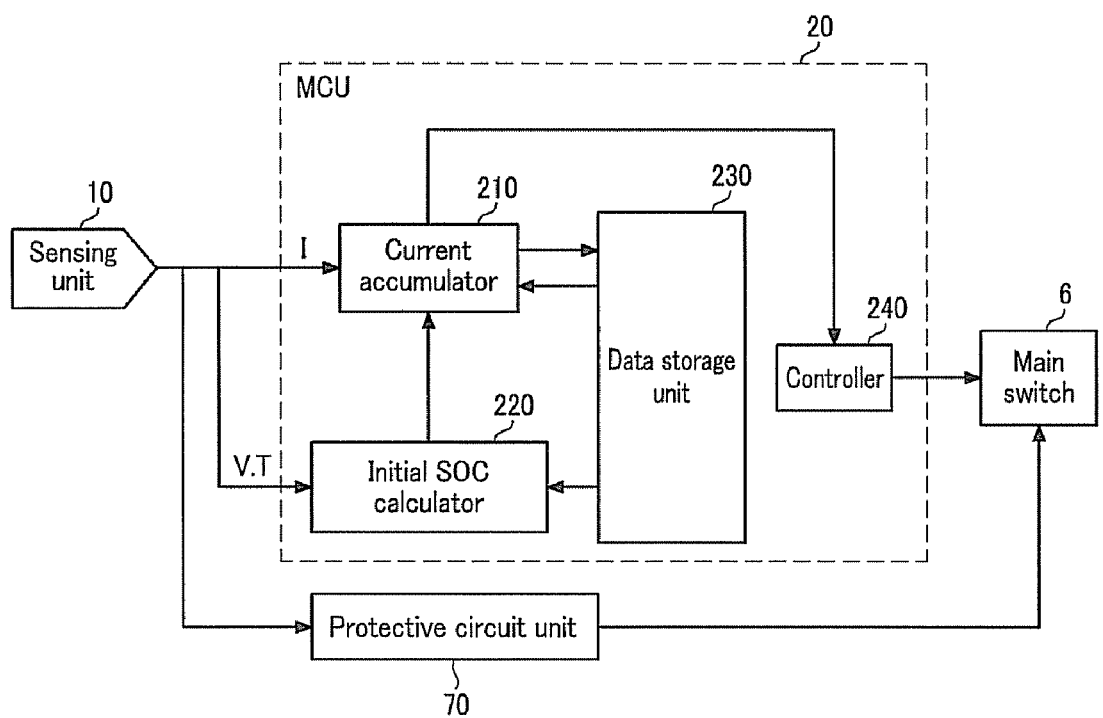
FIG. 2 is a schematic view illustrating the components of an MCU of a battery management system according to an embodiment of the present invention.

As shown in FIG. 2, the MCU 20 comprises a current accumulator 210, an initial SOC calculator 220, a data storage unit 230, and a controller 240.

The initial SOC calculator 220 calculates an initial SOC, using different methods depending on the time period between a current key-on time (time the vehicle is turned on) and a previous key-off time (time the vehicle it turned off). The previous key-off time can be immediately before the current key-on time, for example, the last time the vehicle was turned off. When the period between the previous key-off time and the current key-on time is shorter than a reference idle period (rest time), the SOC at the previous key-off time is calculated as the initial SOC. The reference idle period refers to a time required to stabilize the battery voltage by removing the battery polarization. The reference idle period can be a length of time based upon the parameters of the battery(s) used, and/or the overall electrical system of the vehicle. When the time period between key-off and key-on is less than the reference idle period, the initial SOC calculator 220 computes a battery voltage that is measured after the idle period and the key-on time as an OCV (open circuit voltage).

If the period between the previous key-off time and the current key-on time is greater than the reference idle period, the initial SOC calculator 220 sets the battery voltage transmitted from the sensing unit 10 as an OCV. The initial SOC calculator 220 detects an OCV and the temperature of the battery, and calculates an initial SOC using a data table concerning the SOC, and calculates the initial SOC. Then, the initial SOC calculator 220 calculates the integrated current value corresponding to the calculated initial SOC, and transmits the calculated integrated current value to the current accumulator 210.

The current accumulator 210 integrates the battery current with the integrated initial current value corresponding to the initial SOC, to calculate the current integrated current value. In this example, the current accumulator 210 receives an integrated initial current value corresponding to the initial SOC from the initial SOC calculator 220. The current accumulator 210 then calculates a time integrated value that integrates the battery current with respect to the time, and adds that time integrated value to the integrated initial current value, to calculate the integrated current value. This integration of the battery current with respect to the time can be calculated by using the following Equation 1.

$$\text{INTEGRATED CURRENT VALUE} = \int (i \cdot \eta) dt \quad \text{Equation 1}$$

In this equation, i comprises a charge and/or discharge current that is the battery current output determined by the sensing unit 10, and $\eta$ is an actual charge efficiency of the battery 2. However, aspects of the present invention are not limited thereto, in that the integrated current value may be estimated by other methods know to those skilled in the art.

In some embodiments the data storage unit 230 stores battery state information. In particular, the data storage unit 230 stores an SOC value when the key is off, stores a data table concerning an SOC corresponding to an OCV, and stores the integrated current value corresponding to the SOC.

In various embodiments, the controller 240 determines whether the battery is overcharged or over discharged using an integrated current value input from the current accumulator 210. The controller 240 compares the integrated current value with a reference battery rating capacity. If the integrated current value is larger than the reference battery rating capacity, the controller 240 determines that the battery is overcharged. The battery rating capacity can be a value that is obtained by multiplying current by time, and refers to the charge capacity of the battery when the battery is fully charged. The reference battery rating capacity may be set to a value larger than the rating capacity of the battery. If the integrated current value is less than 0 [Ah], the controller 240 determines that the battery is over discharged. When the battery is overcharged or over discharged, the controller 240 transmits to the MTCU a signal to turn off the main switch 6. When the main switch 6 is turned off, the battery 2 and the motor 9 are cut off. According to some embodiments the controller 240 can transmit overcharge and/or over discharge data to an HCU (Hybrid Control Unit) that is a higher vehicle ECU (Electronic Control Unit) via a CAN (Controller Area Network).

Figure 3:
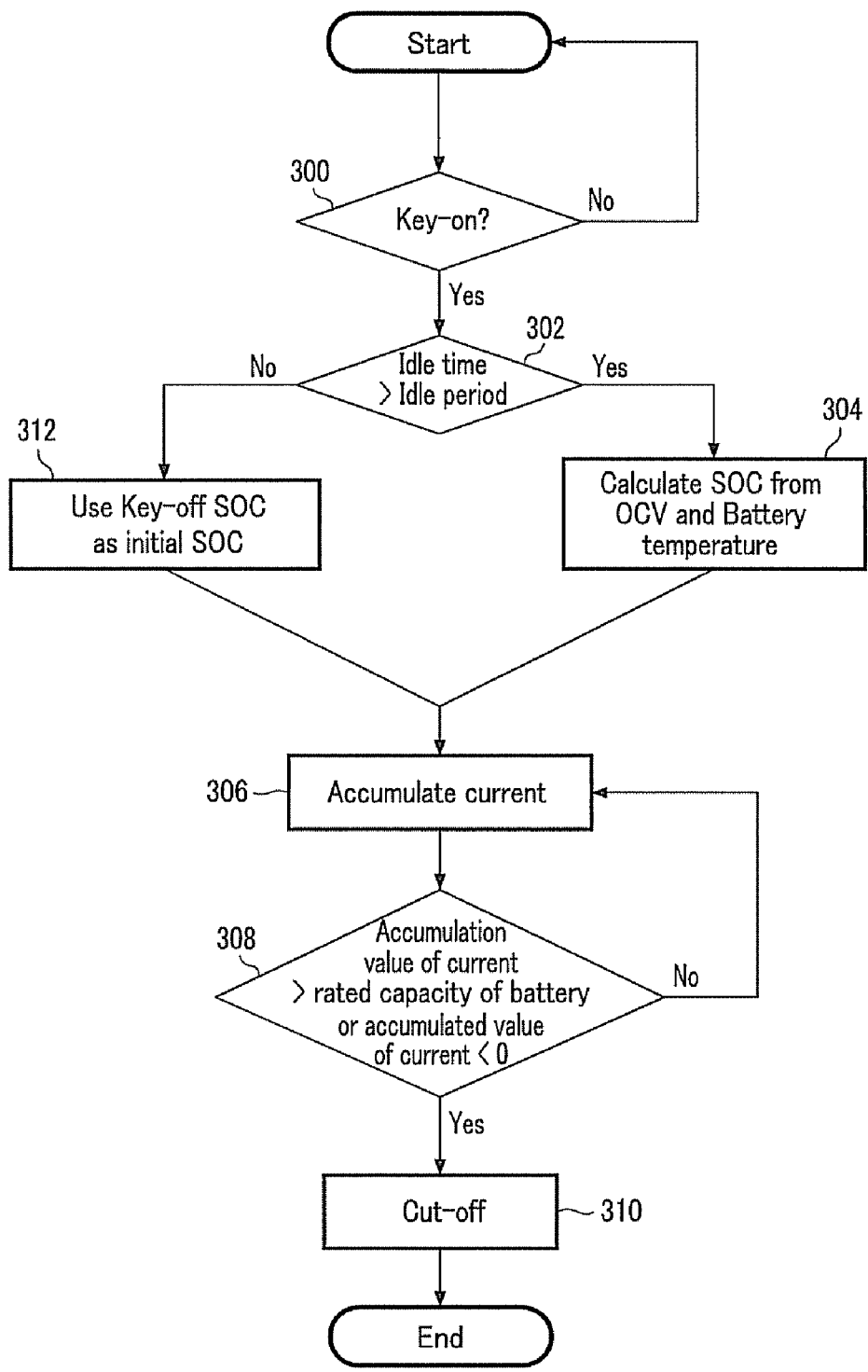
FIG. 3 is a flowchart illustrating a method of battery management according to an embodiment of the present invention.

In some embodiments, and as illustrated in FIG. 3, a method is disclosed for battery management. The method comprises operation 300 where the MCU 20 of the BMC 1 determines whether the key of a vehicle is on. If key is not on, the process restarts from operation 300. If the key is turned on (key-on), the method proceeds to operation 302. In operation 302, a determination is made as to whether the vehicle has been turned off (key-off) for a period of time (idle time) that is longer than a reference idle period. The reference idle period can be a preset time period that relates to the characteristics of a particular battery and/or battery system.

If the idle time is less than the reference idle period, the method proceeds to operation 312. In operation 312 the SOC at the previous key-off time is calculated as the initial SOC. After the SOC is calculated the method proceeds to operation 306.

If the period between the previous key-off time and the current key-on time is longer than the reference idle period, the method proceeds to operation 304. In operation 304, the battery voltage transmitted from the sensing unit 10 is set as an OCV. And then, an SOC is determined using a data table based on the OCV and the temperature of the battery. The integrated initial current value corresponding to the initial SOC is calculated. After the calculations are performed the method proceeds to operation 306.

In operation 306, a current integrating operation is performed that accumulates the battery current with the transmitted integrated initial current value, and thereby estimates the integrated current value.

In operation 308, the controller 240 compares the integrated current value from operation 306, with a threshold voltage range. The threshold voltage range is any integrated current value that is equal to or above the reference battery rating capacity [Ah], or equal to or below an integrated current value that represents a fully discharged battery 0 [Ah]. If the integrated current value is equal to or more than 0 [Ah], and equal to or less than the battery rating capacity [Ah], the method returns to operation 306. If the integrated current value is within the threshold voltage range, for example, if the integrated current value is less than 0 [Ah], or if the integrated current value exceeds the battery rating capacity [Ah], it is determined that the battery is over discharged or overcharged respectively. If the controller 240 detects an overcharge or over discharge the controller 240, the method proceeds to operation 310.

In operation 310, the controller 240 turns off the main switch 6. When the main switch 6 is turned off, the battery 2 and the motor 9 are disconnected, for example, the circuit between the battery 2 and the motor 9 is broken.

Figure 4:
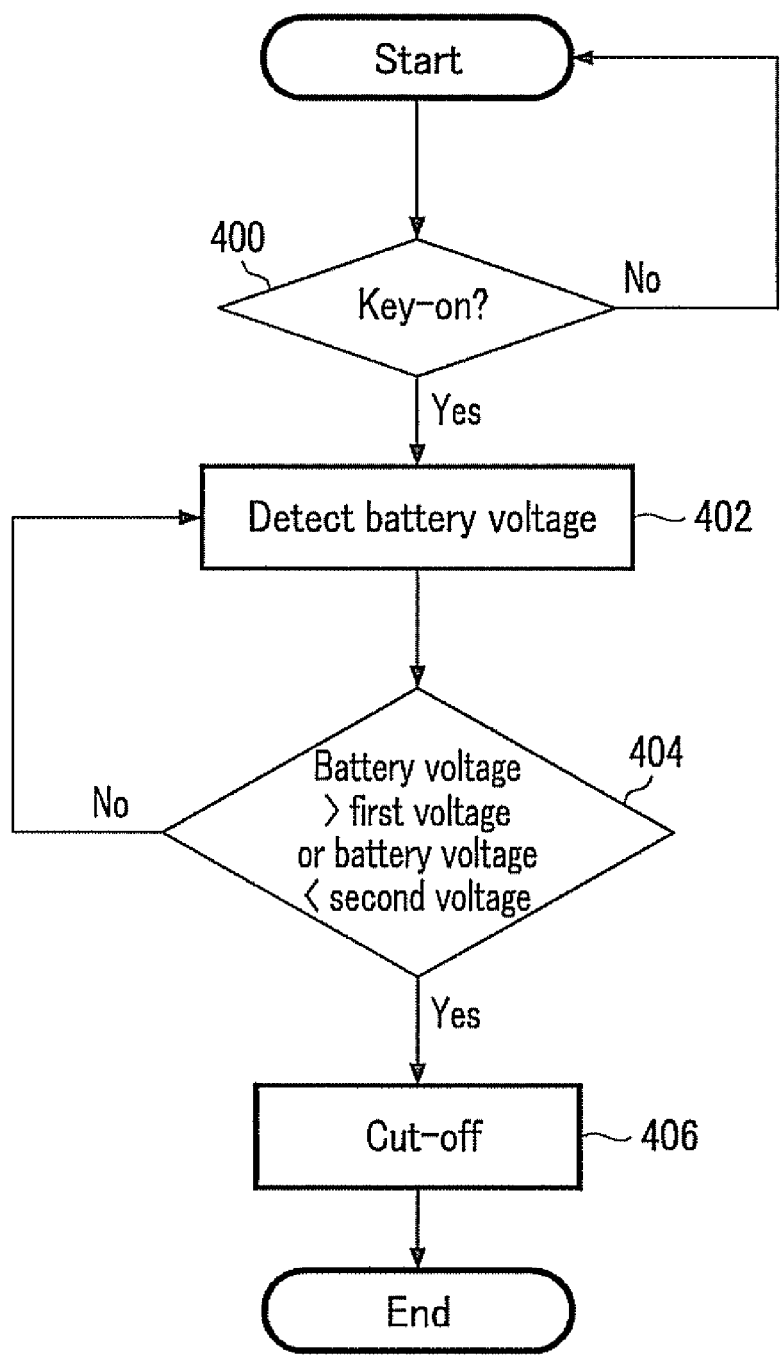
FIG. 4 is a flowchart illustrating a method of battery management according to an embodiment of the present invention.

According to various embodiments, and as illustrated in FIG. 4, a method for battery management is disclosed. The method comprises an operation 400, where the MCU 20 of the BMC 1 determines whether the key of a vehicle is on. If key is not on, the process restarts from operation 400. If the key is turned on (key-on), the method can proceed to operation 402.

In operation 402, the sensing unit 10 detects the battery voltage. The method further comprises an operation 404, where the battery voltage is compared to a threshold voltage range. If the battery voltage is outside the threshold voltage range the process restarts from operation 402. If the battery voltage is within the threshold voltage range, the protective circuit unit 70 determines that the battery is overcharged if the battery voltage exceeds the first voltage, or that the battery is over discharged if the battery voltage is less than the second voltage, and the method proceeds to operation 406.

Figure 5:
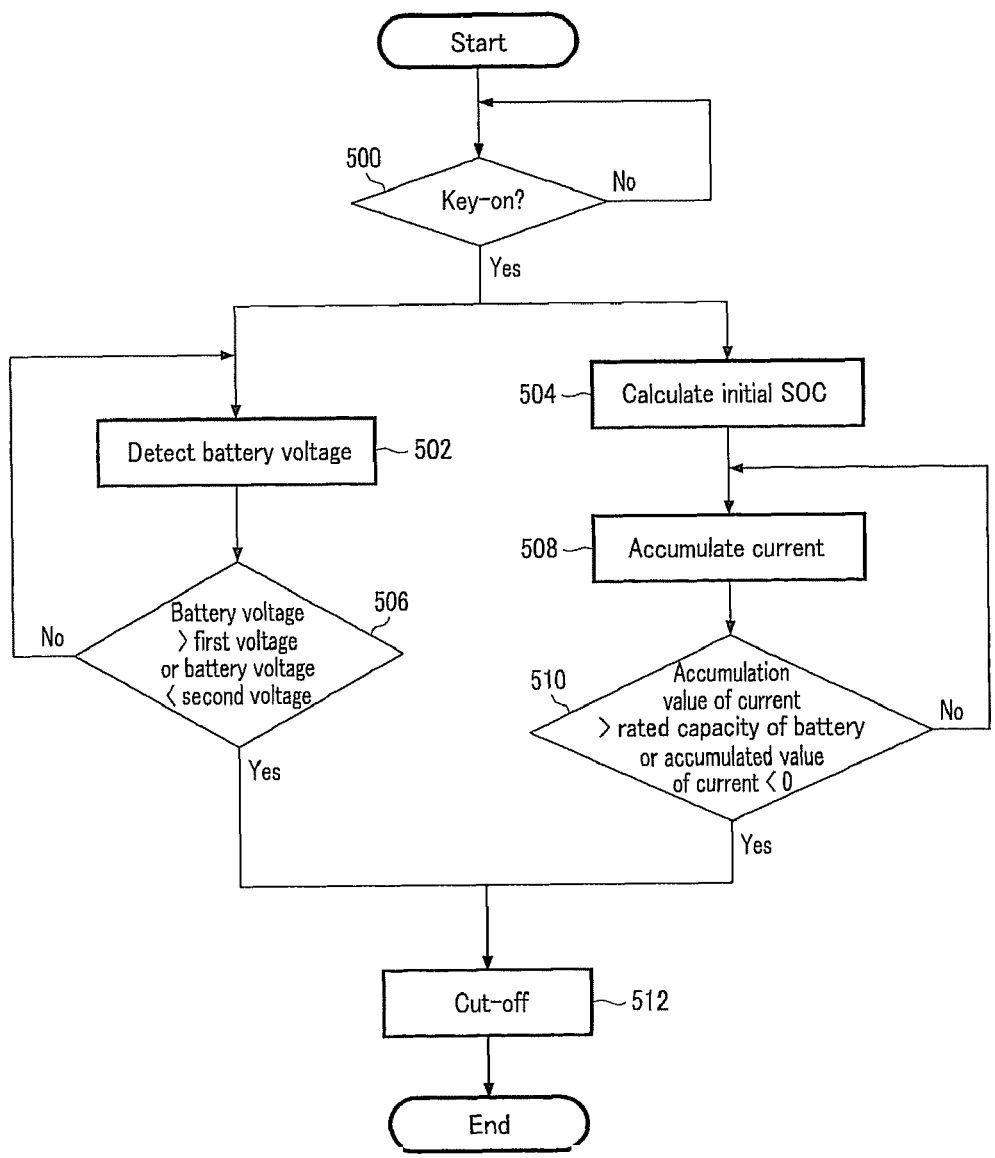
FIG. 5 is a flowchart illustrating a method of battery management according to an embodiment of the present invention.

In operation 406, the protective circuit turns off the main switch 6. When the main switch 6 is turned off, the battery 2, and the motor 9 are disconnected. For example, the circuit between the battery 2 and the motor 9 is broken According to some embodiments, and as illustrated in FIG. 5, the methods as detailed with respect to FIGS. 3 and 4 can be combined into a single method. The method of claim 5 begins with a key-on detection operation 500. If the key is on the method proceeds to operations 502 and 504 simultaneously. Operation 506 can follow operation 502. Operations 502 and 506 comprise the same characteristics as described for operations 402 and 406 above. Operation 504 comprises the same characteristics of operations 304 and 312. Operations 508 and 510 comprise the same characteristics as described for operations 308 and 310, respectively. If an overcharge or an over discharge is detected in either of operations 506 or 510 the method proceeds to operation 512. In operation 512 the electrical connection between the motor and the battery is broken.

As described above, according to the battery management system and method that determines whether the battery is overcharged and over discharged according to an exemplary embodiment of the present invention, an initial SOC is calculated using different methods depending on which period between the previous key-off time and the current key-on time. Further, using a current integrating method that accumulates the battery current to the integrated initial current value corresponding to the calculated initial SOC, the current integrated current value is calculated. It is determined that the battery is overcharged if the integrated current value that is updated by the battery current exceeds the reference battery rating capacity [Ah], and that the battery is over discharged if the integrated current value is less than 0 [Ah], and the main switch 6 is turned off. If the main switch 6 is turned off, the battery 2 and the motor 9 are disconnected. According to the related art, the battery voltage is compared with the threshold voltage range. If the battery voltage is equal to or more than the first voltage, it is determined that the battery is overcharged. If the battery voltage is equal to or less than the second voltage, it is determined that the battery is over discharged, and the motor-generator is cut off. In order to prevent the continuous over charging and over discharging due to an abnormality in the battery voltage detecting circuit, the battery can be stably managed by strengthening the protecting function of the BMS.

According to various aspects of the present invention, provided is a battery management system and method that is capable of determining whether the battery is overcharged or over discharged using an integrated current value.

Further, provided is a battery management system and a method that is capable of preventing the continuous over charging or over discharging due to the abnormality in the battery voltage detecting circuit. Further, it is possible to stably and exactly prevent the battery from being overcharged or over discharged.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery management system comprising a power device, a battery, and a main switch connecting the power device and the battery, comprising:
    a sensing unit that measures a current, a voltage, and a temperature of the battery;
    a micro controller unit (MCU) that integrates the battery current to generate the integrated current value, and determines whether the battery is overcharged or over discharged, using the integrated current value; and
    a protective circuit unit that determines whether the battery is overcharged or over discharged, using a comparison result of the battery voltage and a threshold voltage range.

2. The battery management system of claim 1, wherein the MCU comprises:
    an initial SOC calculator that calculates an initial SOC to calculate the integrated current value corresponding to the initial SOC;
    a current accumulator that estimates the current integrated current value using a current integrating method that accumulates the battery current with the integrated current value corresponding to the initial SOC; and
    a controller that receives the integrated current value from the current accumulator to determine whether the battery is overcharged or over discharged.

3. The battery management system of claim 2, wherein the initial SOC calculator
    calculates an SOC as the initial SOC at a previous key-off time if a period between the previous key-off time and a current key-on time is shorter than an idle period, and
    calculates the initial SOC using a data table comprising a plurality of initial SOCs corresponding to particular OCVs and temperatures, if the period between the previous key-off time and the current key-on time is longer than the idle period.

4. The battery management system of claim 3, further comprising a data storage unit that stores the data table.

5. The battery management system of claim 2, wherein the current accumulator integrates the battery current with respect to a time, to calculate the current integrated current value.

6. The battery management system of claim 2, wherein the controller determines that the battery is over discharged if the integrated current value is less than 0 [Ah], and determines that the battery is overcharged if the integrated current value exceeds a reference battery rating capacity [Ah], and turns off the main switch when the battery is overcharged or over discharged to break the connection between the battery and the power device.

7. The battery management system of claim 1, wherein the threshold voltage range comprises any voltage equal to or greater than a first voltage comprising a fully charged battery voltage, and comprises any voltage equal to or less than a second voltage comprising a fully discharged, and
    when battery voltage is within the threshold voltage range the main switch is turned off, and the protective circuit unit breaks the connection between the battery and the power device.

8. A battery management method for a battery management system comprising a power device, a battery, and a main switch connecting the power device and the battery, the method comprising:
    calculating an initial SOC, and setting an integrated current value corresponding to the initial SOC as an initial integrated current value;

generating a current integrated current value by integrating the battery current with the initial integrated current value;

determining whether the battery is overcharged or over discharged using the integrated current value;

detecting the battery voltage; and comparing the battery voltage with a threshold voltage range to determined whether the battery is overcharged or over discharged.

9. The battery management method of claim 8, wherein the calculating of the initial SOC comprises:

setting the SOC at a previous key-off time as the initial SOC, when a period between the previous key-off time and a current key-on time is shorter than an idle period; and calculating the initial SOC using a data table comprising a plurality of initial SOCs corresponding to particular OCVs and a temperatures, when the period between the previous key-off time and the current key-on time is longer than the idle period.

10. The battery management method of claim 8, wherein the generating of a current integrated current value comprises calculating the integrated current value by adding an integration of the battery current with respect to a time, and the integrated initial current value.

11. The battery management method of claim 8, wherein the determining of whether the battery is overcharged or over discharged comprises:

determining that the battery is overcharged if the integrated current value is more than a reference battery rating capacity [Ah]; and determining that the battery is over discharged if the integrated current value is less than 0 [Ah].

12. The battery management method of claim 8, wherein the comparing of the battery voltage with a threshold voltage range comprises:

determining whether the threshold voltage range is larger than a first voltage of the battery when fully charged;

determining whether the threshold voltage range is less than a second voltage of the battery when fully discharged; and determining that the battery is overcharged when the battery voltage is larger than the first voltage, and that the battery is over discharged when the battery voltage is less than the second voltage.

13. The battery management method of claim 11, further comprising using the main switch when the battery is overcharged or over discharged, to break the connection between the battery and the power device.

14. A battery management method for managing a battery, comprising:

calculating an initial SOC of the battery;

measuring the battery current to produce a battery current value; and calculating a current integrated current value of the battery using the initial SOC and the battery current value; and determining whether the battery is overcharged or over discharged using the current integrated current value.

15. The battery management method of claim 14, further comprising:

detecting the battery voltage; and comparing the battery voltage with a threshold voltage range, to determined whether the battery is overcharged or over discharged.

16. The battery management method of claim 14, further comprising breaking a connection between the battery and a motor when the battery is determined to be overcharged or over discharged.

17. The battery management method of claim 14, wherein the calculating of an initial SOC comprises:

recording the SOC at a key-off;

determining a key-on; and calculating an idle time comprising a time period between the key-off and the key-on.

18. The battery management method of claim 17, wherein the determining of an initial state of charging further comprises:

providing a reference idle period determining whether the idle time is less than the reference idle period; and using the recorded SOC as the initial SOC if the idle period is less than the reference period.

19. The battery management method of claim 17, wherein the determining of an initial state of charging further comprises:

determining that the idle time is greater than the reference idle period;

determining the open current voltage of the battery;

determining the temperature of the battery; and retrieving an initial SOC from a data table using the temperature of the battery and the open current voltage of the battery.

20. The battery management method of claim 14, wherein the calculating of a current integrated current value comprises, adding a value that represents the integration the battery current with respect to time, to the integrated initial current value, to produce the current integrated current value.

21. The battery management method of claim 14, wherein the determining of whether the battery is overcharged or over discharged using the integrated current value, comprises:

determining whether the battery is overcharged by calculating whether the integrated current value is more than a reference battery rating capacity [Ah]; and determining whether the battery is over discharged by calculating whether the integrated current value is less than 0 [Ah].

22. The battery management method of claim 14, wherein the determining whether the battery is overcharged or over discharged comprises:

providing a threshold voltage range, comprising, any voltage above a first battery voltage when the battery is fully charged, and any voltage less than a second battery voltage when the battery is fully discharged; and determining whether the battery voltage is within the threshold range.

23. The battery management method of claim 14, further comprising using a main switch to break a connection between the battery and a power device when the battery is determined to be overcharged or over discharged.

* * * * *

UNITED STATES PATENT AND TRADEMARK OFFICE
CERTIFICATE OF CORRECTION

PATENT NO. : 7,768,235 B2  
APPLICATION NO. : 11/768506  
DATED : August 3, 2010  
INVENTOR(S) : Yong-Jun Tae et al.

Page 1 of 1

It is certified that error appears in the above-identified patent and that said Letters Patent is hereby corrected as shown below:

On the Title Page

None

In the Claims

| | |
|---|---|
| Column 10, Claim 7, line 55 | After "discharged" Insert -- battery voltage -- |
| Column 11, Claim 9, line 18 | Delete "a" |
| Column 12, Claim 15, line 2 | Delete "determined" Insert -- determine -- |
| Column 12, Claim 18, line 17 | After "period" Insert -- ; -- |
| Column 12, Claim 20, line 34 | After "integration" Insert -- of -- |

Signed and Sealed this  
Sixth Day of December, 2011

David J. Kappos  
*Director of the United States Patent and Trademark Office*